United States Patent [19] [11] 4,410,406
Kohmoto et al. [45] Oct. 18, 1983

[54] PROCESS FOR PREPARING MAGNETIC RECORDING MEDIUM

[75] Inventors: Osamu Kohmoto; Takahiro Yamamoto, both of Tokyo, Japan

[73] Assignee: TDK Electronics Co., Ltd., Tokyo, Japan

[21] Appl. No.: 320,439

[22] Filed: Nov. 12, 1981

[30] Foreign Application Priority Data

Nov. 24, 1980 [JP] Japan ................................ 55-164899

[51] Int. Cl.³ ............................................. C23C 15/00
[52] U.S. Cl. ................................ 204/192 M; 427/132
[58] Field of Search ................... 204/192 M; 427/132; 428/900, 694; 252/62.54

[56] References Cited

U.S. PATENT DOCUMENTS 3,549,417 12/1970 Judge et al. .......................... 427/132

FOREIGN PATENT DOCUMENTS 2712 7/1979 European Pat. Off. .

Primary Examiner—Bernard D. Pianalto
Attorney, Agent, or Firm—Oblon, Fisher, Spivak, McClelland & Maier

[57] ABSTRACT

A magnetic recording medium is prepared by forming a thin magnetic layer having the formulation

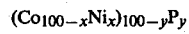

$$(Co_{100-x}Ni_x)_{100-y}P_y$$

wherein x is in a range of 0 to 35 wt. % and y is in a range of more than 0 wt. % to 6 wt. % on a non-magnetic substrate by a sputtering method.

7 Claims, No Drawings

PROCESS FOR PREPARING MAGNETIC RECORDING MEDIUM

BACKGROUND OF THE INVENTION

1. Field of the Invention

The present invention relates to a process for preparing a magnetic recording medium. More particularly, it relates to a process for preparing a continuous thin layer type magnetic recording medium having a Co-Ni-P type thin magnetic layer.

2. Description of the Prior Art

Recently, a continuous thin layer type magnetic recording medium having a metallic thin magnetic layer has been considered to be important. It has been known that a Co-Ni-P type thin metallic layer as one of the thin magnetic layers of such continuous thin layer type magnetic recording media has excellent coercive force and squareness ratio. Heretofore, the Co-Ni-P type thin magnetic layer of the magnetic recording medium has been usually prepared by a plating process such as an electro-plating process and a chemical plating process. However, various disadvantages are found in such plating processes. Firstly, an adhesiveness of the thin layer to a substrate and a mechanical strength of the membrane are low to cause the wearing and peeling-off of the thin layer by friction of a magnetic head thereby changing the magnetic characteristics such as reduction of output characteristics. In order to overcome the disadvantages, a protective layer is formed on the surface of the thin magnetic layer. However, an increase of an effective gap between the magnetic layer and the magnetic head causes to increase a spacing loss and to reduces the recording and reproducing output.

Secondly, the flatness of the thin magnetic layer is inferior and the output in the high frequency region, is disadvantageously reduced.

Thirdly, the thin magnetic layer is contaminated by an alkali metal ion, an acid or a base in the plating bath whereby the magnetic characteristics of the thin magnetic layer are changed and deteriorated. Sometimes, the magnetic head is disadvantageously corroded.

Fourthly, the third harmonic distortion at 333 Hz is remarkably large in the application of an audio tape though the reason is not clearly found. These disadvantages are serious in the practical use.

SUMMARY OF THE INVENTION

It is an object of the present invention to provide a process for preparing a continuous thin layer type magnetic recording medium having a Co-Ni-P type thin magnetic layer which has high mechanical strength of the layer, high adhesiveness of the layer to a substrate; excellent surface property of the layer; remarkably small change of the magnetic characteristics by aging; and remarkably small third harmonic distortion at 333 Hz.

The foregoing and other objects of the present invention have been attained by providing a process for preparing a magnetic recording medium which comprises forming a thin magnetic layer having the formulation:

$$(Co_{100-x}Ni_x)_{100-y}P_y$$

wherein x is in a range of 0 to 35 wt.% and y is in a range of more than 0 wt.% to 6 wt.% on a non-magnetic substrate by a sputtering method.

DETAILED DESCRIPTION OF THE PREFERRED EMBODIMENTS

The inventors have repeatedly studied to attain said objects and have found that when the Co-Ni-P type thin magnetic layer is formed by a sputtering method, the mechanical strength of the layer and the adhesiveness of the layer are remarkably higher than those of the plating method and the surface property is superior and moreover, a change of the magnetic characteristics in a long time storage under high temperature and high humidity condition is quite small and a third harmonic distortion at 333 Hz is remarkably small though these effects have not been expected. The present invention has been attained by the finding.

The Co-Ni-P type thin metallic layer having the formulation has been formed by the plating method. Thus, the preparation of the Co-Ni-P type thin metallic layer by a sputtering method and the application to the magnetic recording medium and excellent effects resulted by the application have not been known.

The sputtering method is a technology for vapor depositions and is employed instead of a vacuum evaporation. However, according to the studies, it has been found that the third harmonic distortion at 333 Hz is quite larger than that of the plating method, when the Co-Ni-P type thin magnetic layer having the formulation is formed by a vacuum evaporation at an oblique incident angle deposition. Moreover, in accordance with the oblique incidence deposition method, a change of the magnetic characteristics in a long time storage under high temperature and high humidity condition is larger and the flatness is inferior and the output at high frequency is lower in comparison with those of the present invention. Moreover, the strength of the magnetic layer and the adhesiveness of the layer are inferior to cause serious wearing and peeling-off by friction of the magnetic head.

The present invention will be further illustrated in detail.

The thin magnetic layer formed by the process of the present invention comprises Co, Ni and P as $(CO_{100-x}Ni_x)_{100-y}P_y$ wherein a ratio of $CO/(CO+Ni)$ as x is in a range of 0 to 35 Wt.%. When x is more than 35 wt.%, the magnetic characteristic especially a coercive force Hc is inferior. In view of the coercive force Hc, it is preferable that x is in a range of 0 to 30 wt.% especially 0 to 28 wt.%. On the other hand, a content of P as y is in a range of more than 0 wt.% and up to 6 wt.%. When y is more than 6 wt.%, the magnetic characteristics especially the coercive force Hc is inferior. In view of the coercive force Hc, it is preferable that y is in a range of 1 to 6 wt.% especially 1.5 to 5.5 wt.%.

The thin magnetic layer formed by the process of the present invention has the aforementioned formulation. In the thin magnetic layer, it is also possible to incorporate one or more other components such as the other transition metal component such as Fe, Cr, Mn and Mo beside Co and Ni at a ratio of 10 wt.% or less.

The thickness of the thin magnetic layer having the formulation is not critical and can be selected depending upon the kind of the magnetic recording medium for analog recording, digital recording or the other uses. It is usual that the layer is formed as a continuous thin layer having a thickness of 500 Å to several μm on a non-magnetic substrate.

The substrate is non-magnetic substrate and the material and shape of the substrate are not critical and can be selected depending upon the use of the magnetic recording medium.

In accordance with the process of the present invention, the thin magnetic layer is formed on the substrate by the sputtering process. The sputtering can be RF sputtering or DC sputtering and the apparatus for sputtering can have two electrodes or four electrodes. Moreover, a magnetron sputtering apparatus can be also used. Sometimes, the reactive sputtering under feeding P component can be also used.

The target can be a Co-Ni-P sintered product having the aforementioned formulation.

The ion source for bombarding ions can be an inert gas such as Ar, Kr and Xe. The inert gas is preferably maintained under a pressure of $2 \times 10^{-2}$ Torr or more in the operation. When the pressure is lower, the magnetic characteristics especially the coercive force Hc of the resulting thin magnetic layer are inferior. On the other hand, when the pressure is higher in the operation, the sputterate is inferior. Therefore, the pressure in the operation is preferably in a range of about $5 \times 10^{-2}$ to $2 \times 10^{-1}$ Torr.

The plate voltage, the plate current and the gap between the electrodes are not critical and can be selected depending upon these condition, as desired.

In the DC sputtering process, it is preferable to place a film such as polyethyleneterephthalate film on a metal cylinder or plate surface which can be cooled with a coolant and to apply high DC acceleration voltage between the target and the metal cylinder or plate. The voltage is depending upon conditions of a gap between the target and the metal cylinder or plate and a film and a speed of the film and is usually in a range of 200 V to 20 kV preferably 200 V to 2 kV especially 500 V to 1 kV. The target is preferably a thin layer in broad surface area. A magnet can be placed behind the target to result in a magnetron sputtering.

The electric power is usually in a range of 1 W/cm$^2$ to 500 W/cm$^2$ preferably 1.5 W/cm$^2$ to 100 W/cm$^2$ especially 5 W/cm$^2$ to 20 W/cm$^2$.

In the ion beam sputtering, the acceleration voltage is usually in a range of 200 V to 10 kV preferably 200 V to 1 kV especially 400 V to 600 V and the current density is usually in a range of 0.5 mA/cm$^2$ to 50 mA/cm$^2$ preferably 0.5 mA/cm$^2$ to 10 mA/cm$^2$.

In the RF sputtering process, the radio frequency is usually decided in view of the wave regulation and the acceleration voltage is usually in a range of 1 kV to 100 kV preferably 1 kV to 10 kV.

The structure and feature of the ion beam sputtering and the RF sputtering can be similar to those of the DC sputtering process. The DC sputtering process is preferable in view of a high deposition rate.

In the electron beam sputtering, an electron beam source can be placed in the position of reflection to the target for example, the electron beam is applied to the surface of the target to emit the target source in the reflecting direction and the film is placed to deposit the emitted target source.

The sputtering process is different from the vacuum evaporation process, because the sputtering is performed in an inert gas such as Ar, Kr and Xe in a reduced pressure of $5 \times 10^{-2}$ to $2 \times 10^{-1}$ Torr whereby the target source is emitted by the sputtering.

The resulting thin magnetic layer has high coercive force as a maximum of 1,000 Oe and high squareness ratio as a maximum of 0.75 as excellent magnetic characteristics. The thin magnetic layer has not any magnetic anisotropy whereby the usages as the magnetic medium are not limited, though the product obtained by the oblique incidence deposition can not be used as a magnetic disk.

The thin magnetic layer formed by the process of the present invention has high adhesiveness and high strength of the layer and accordingly, it is not always necessary to form a protective layer as an upper layer. If necessary, the protective layer can be formed. The magnetic recording medium is prepared by a desired processing if necessary.

The formulation of the magnetic layer can be varied from the formulation of the target depending upon a condition in the sputtering. The formulation of the target and the sputtering condition can be controlled depending upon a desired formulation of the magnetic layer. The ratio of Co to Ni is not usually varied but the ratio of P to Co and Ni is easily varied depending upon the sputtering condition.

The magnetic recording medium prepared by the process of the present invention is useful as various magnetic tapes, magnetic disks, magnetic drums, magnetic sheets, magnetic cards and magnetic scales.

In accordance with the process of the present invention, the magnetic characteristics of the thin magnetic layer of the magnetic recording medium such as the coercive force Hc and the squareness ratio are remarkably high.

The flatness of the thin magnetic layer is remarkably superior to those of the other processes and an output reduction in high frequency or short wave recording is remarkably small. Moreover, the strain to third harmonic distortion at 333 Hz is remarkably small. When it is used as a magnetic recording tape for audio, the characteristics are especially superior. It is found that the strain in the presence invention is only about ⅓ of that of the plating method and about 1/5 of that of the vacuum evaporation especially the oblique incidence deposition. Moreover, the change of the magnetic characteristics is remarkably small even though it is stored under high temperature and high humidity condition or in a chemically reactive environment for a long time. The change is smaller than that of the vacuum evaporation. The strength of the thin magnetic layer and the adhesiveness of the layer are remarkably high and the wearing and peeling off caused by the friction of the magnetic head are remarkably small.

The present invention will be further illustrated by certain examples and references which are provided for purposes of illustration only and are not intended to be limiting the present invention.

EXAMPLE 1

A sintered product having the formulation of

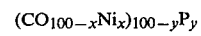

$(Co_{100-x}Ni_x)_{100-y}P_y$ wherein x is 15 wt.% and y is 4.8 wt.% was prepared as a target and Co-Ni-P type thin magnetic layer was formed in a polyethyleneterephthalate film having a thickness of 15 μm by the RF sputtering method. A distance between the target and the film was set to 60 mm and a plate voltage and a plate current were respectively set to 2 kV and 1.5 mA/cm$^2$. On the other hand, argon was used as an inert gas and the pressure of argon was maintained to $0.7 \times 10^{-1}$ Torr during the operation. The sputtering was carried out under the condition. It was found that the thin magnetic layer covered the whole surface at a uniform thickness of 3000 Å and had a uniform formulation of $(Co_{85}Ni_{15})_{95.2}P_{4.8}$.

As a reference, a thin magnetic layer having a thickness of 3000 Å and the same formulation was formed on a polyethyleneterephthalate film having a thickness of 15 μm by the conventional electric plating in the conventional sulfamic acid bath.

The resulting coated products were respectively slitted by a slitter to give a predetermined width to prepare Cassette tape A of the invention and Cassette tape B of the reference.

Each coercive force Hc and each squareness ratio and each maximum output level (MOL) at 14 kHz of Cassette tapes A and B were measured. The results are shown in Table 1.

TABLE 1

|  | Tape A (Invention) | Tape B (Reference) |
|---|---|---|
| Coercive force Hc (Oe) | 1000 | 800 |
| Squareness | 0.74 | 0.70 |
| 14 kHz MOL (dB) | +1.1 dB | — |

In Table 1, 14 kHz MOL is shown as the output level difference to the type B. The reason of higher MOL of the tape A may be the superior surface property.

Moreover, changes in the magnetic characteristics in storage were measured. The tapes A and B were stored under a condition of 50° C. and 90% relative humidity for 150 days and then, such coercive force Hc and each residual magnetic flux density Br and each MOL at 14 kHz of the tapes were respectively measured. The decrease of Hc and Br (in percentage) and the difference of output level at 14 kHz MOL before and after storage are measured as shown in Table 2.

TABLE 2

|  | Tape A (Invention) | Tape B (Reference) |
|---|---|---|
| Change of Hc and Br after 150 days storage under condition (50° C. 90% RH storage for 150 days) | | |
| Δ Hc/Hc (%) | −3 | −8 |
| Δ Br/Br (%) | −2 | −7 |
| 14 kHz MOL (dB) | −1.5 | −5.2 |

Each peeling off was evaluated by the 200 times passing test using a cassette deck for the tapes A and B. Such tape was passed for 200 times at 40° C. and 80% RH after recording and then, it was reproduced to measured times of the level reduction of 30 dB or more. The times of the level reduction of 3 dB or more of the tape A or B is calculated to be the times per minute. The results are shown in Table 3.

TABLE 3

|  | Tape A (Invention) | Tape B (Reference) |
|---|---|---|
| Times of level reduction more than 3 dB | 3 | 10 |

The strain to third harmonic wave at 333 Hz of the tape A or B was also measured.

In the test, a Co-Ni-P type thin magnetic layer having a thickness of 3000 Å and the formulation was formed on a polyethyleneterephthalate film by the oblique incident deposition at 60 degree to prepare Cassette tape C. The strain of the tape was also measured. The results are shown in Table 4.

TABLE 4

|  | Tape A (Invention) | Tape B (Reference) | Tape C (Reference) |
|---|---|---|---|
| 3rd harmonic distortion | 1.1 | 3.3 | 5.0 |

EXAMPLE 2

In accordance with the process of Example 1 for Tape A except varying the argon pressure in the RF sputtering operation as shown in Table 5, each thin magnetic layer was formed to prepared two kinds of Cassette tapes D and E and each coercive force Hc and each squareness ratio of the tapes were measured. The results are shown in Table 5.

TABLE 5

|  | Tape D | Tape A | Tape E |
|---|---|---|---|
| Ar pressure (Torr) | $2 \times 10^{-1}$ | $7 \times 10^{-2}$ | $1 \times 10^{-2}$ |
| Coercive force Hc (Oe) | 800 | 1000 | 100 |
| Squareness | 0.70 | 0.74 | 0.70 |

EXAMPLE 3

In accordance with the process of Example 1 except varying the formulation of the target, seven kinds of Cassette tapes G to M were respectively prepared by the RF sputtering under the same condition and each formulation of the layer, each coercive force Hc, each squareness ratio, each strain to third harmonic distortion at 333 Hz and each 14 kHz MOL and each output level difference of 14 kHz MOL after storage was compared to that of the tape B, (dB) of the tapes G to M were measured and the tapes G to M were stored at 50° C. and 90% RH for 150 days and each output level difference of 14 kHz MOL after storage compared to that of the tape B was also measured. The results are shown in Table 6.

The results of Table show excellent characteristics of the magnetic recording media of the present invention.

TABLE 6

|  | Tape | | | | | | | |
|---|---|---|---|---|---|---|---|---|
|  | A | G | H | I | J | K | L | M |
| Formulation $(Co_{100-x}Ni_x)_{100-y}P_y$ | | | | | | | | |
| x (wt. %) | 15 | 15 | 15 | 15 | 30 | 22 | 10 | 0 |
| y (wt. %) | 4.8 | 5.5 | 4 | 3 | 4.8 | 4.8 | 4.5 | 4 |
| Coercive force Hc (Oe) | 1000 | 700 | 600 | 450 | 400 | 650 | 750 | 500 |
| Squareness | 0.74 | 0.55 | 0.69 | 0.65 | 0.50 | 0.62 | 0.69 | 0.71 |
| 333 Hz - Strain (%) | 1.1 | 1.3 | 1.2 | 1.1 | 1.2 | 1.4 | 1.2 | 1.0 |

TABLE 6-continued

| | Tape | | | | | | | |
|---|---|---|---|---|---|---|---|---|
| | A | G | H | I | J | K | L | M |
| 14 kHz MOL (dB) | +1.1 | +0.7 | +0.5 | +0.3 | +0.2 | +0.5 | +0.8 | +0.4 |
| After storage 14 kHz MOL (dB) | −1.5 | −1.7 | −1.2 | −1.3 | −1.4 | −1.2 | −1.1 | −1.0 |

We claim:

1. A process for preparing a magnetic recording medium comprising a thin magnetic layer of the formulation $$(Co_{100-x}Ni_x)_{100-y}P_y$$

wherein x is in a range of 0 to 35 wt. % and y is in a range of up to 6 wt. %, which process comprises forming said thin magnetic layer upon a non-magnetic substrate by a sputtering method carried out in an inert atmosphere with a target comprising a Co-Ni-P alloy of said formulation.

2. The process according to claim 1 wherein said sputtering method is carried out in argon gas at $2 \times 10^{-2}$ Torr or more.

3. The process according to claim 1 wherein the formulation is $(Co_{100-x}Ni_x)_{100-y}P_y$ wherein x is in a range of 6 to 28 wt.% and y is in a range of 1 to 5.5 wt.%.

4. The process according to claim 1 wherein said sputtering method is carried out in argon gas at $5 \times 10^{-2}$ to $2 \times 10^{-1}$ Torr.

5. The process according to claim 1 wherein said sputtering method is a reactive sputtering method.

6. The process according to claim 1 wherein said sputtering method is RF sputtering method or DC sputtering method.

7. The process according to claim 1 wherein said sputtering method is a magnetron sputtering method.

* * * * *